(12) United States Patent
Lee

(10) Patent No.: US 6,661,283 B1
(45) Date of Patent: Dec. 9, 2003

(54) WIDE GAIN RANGE AND FINE GAIN STEP PROGRAMMABLE GAIN AMPLIFIER WITH SINGLE STAGE SWITCHED CAPACITOR CIRCUIT

(75) Inventor: Bumha Lee, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/262,615

(22) Filed: Oct. 3, 2002

(51) Int. Cl.[7] .................................................. H03F 1/02
(52) U.S. Cl. .............................. 330/9; 330/69; 327/124
(58) Field of Search .............................. 330/9, 69, 86, 330/141; 327/124

(56) References Cited

U.S. PATENT DOCUMENTS 4,849,707 A * 7/1989 Nicollini ........................ 330/9
5,410,270 A * 4/1995 Rybicki et al. ................. 330/9
5,805,019 A * 9/1998 Shin ............................... 330/9
6,169,427 B1 1/2001 Brandt ........................ 327/94

* cited by examiner

Primary Examiner—Henry Choe
(74) Attorney, Agent, or Firm—Merchant & Gould; Mark R. Hennings

(57) ABSTRACT

The present invention is directed towards a single stage switched capacitor programmable gain amplifier. The operation of the amplifier is described by a transfer function having two gain factors: (C1/C2) and (C2/C3). The transfer function is equal to the product of the two gain factors: (C1/C2)×(C2/C3) such that the transfer function is equal to (C1/C3). The combination of the two different gain factors provides a wider range and finer step programmability of the amplifier. The amplifier does not have an idle phase, which reduces power dissipation. Additionally, the amplifier requires less switching which results in reducing the thermal noise and the switching noise produced by the amplifier.

18 Claims, 5 Drawing Sheets

WIDE GAIN RANGE AND FINE GAIN STEP PROGRAMMABLE GAIN AMPLIFIER WITH SINGLE STAGE SWITCHED CAPACITOR CIRCUIT

FIELD OF THE INVENTION

The present invention relates generally to programmable gain amplifiers, and more particularly to switched capacitor circuit amplifiers.

BACKGROUND OF THE INVENTION

Advances in analog signal processing require programmable gain amplifiers that are capable of amplifying a wide dynamic range of analog input signals. Additionally, such amplifiers are required to finely control the amount of the gain that is applied to an analog input signal. As target resolutions and operating speeds increase, power dissipation also undesirably increases. Multiple stage programmable gain amplifiers are used to achieve wide dynamic ranges. However, operational amplifiers consume a disproportionate amount of power.

SUMMARY OF THE INVENTION

The present invention is directed towards a switched capacitor programmable amplifier circuit. According to one aspect of the invention, the switched capacitor programmable amplifier circuit comprises a first, second, and third capacitor and an amplifier. The first capacitor is configured to store a sampled charge that is associated with an input signal during a sampling phase and transfer the sampled charge during a holding phase. The second capacitor is configured to discharge during the sampling phase and provide a first capacitive feedback path such that a first amplified charge is stored on the second capacitor during the holding phase. The third capacitor is configured to provide a second capacitive feedback path during the sampling phase and discharge during the holding phase. The amplifier is configured to amplify the transferred sampled charge using the first capacitive feedback path to produce the first amplified charge during the holding phase and amplify the stored first amplified charge using the second capacitive feedback path to produce a second amplified charge during the sampling phase.

According to another aspect of the invention, a method for amplifying a signal comprises storing a sampled charge that is associated with an input signal during a sampling phase on a first capacitor. The sampled charge is transferred from the first capacitor during the holding phase. A first capacitive feedback path is provided through which a first amplified charge is stored on a second capacitor during the holding phase. A second capacitive feedback path is provided during the sampling phase. The transferred sampled charge is amplified using the first capacitive feedback path to produce the first amplified charge during the holding phase. The stored first amplified charge is amplified using the second capacitive feedback path to produce a second amplified charge during the sampling phase.

A more complete appreciation of the present invention and its improvements can be obtained by reference to the accompanying drawings, which are briefly summarized below, to the following detailed description of illustrated embodiments of the invention, and to the appended claims.

DETAILED DESCRIPTION OF THE PREFERRED EMBODIMENT

Figure 1:
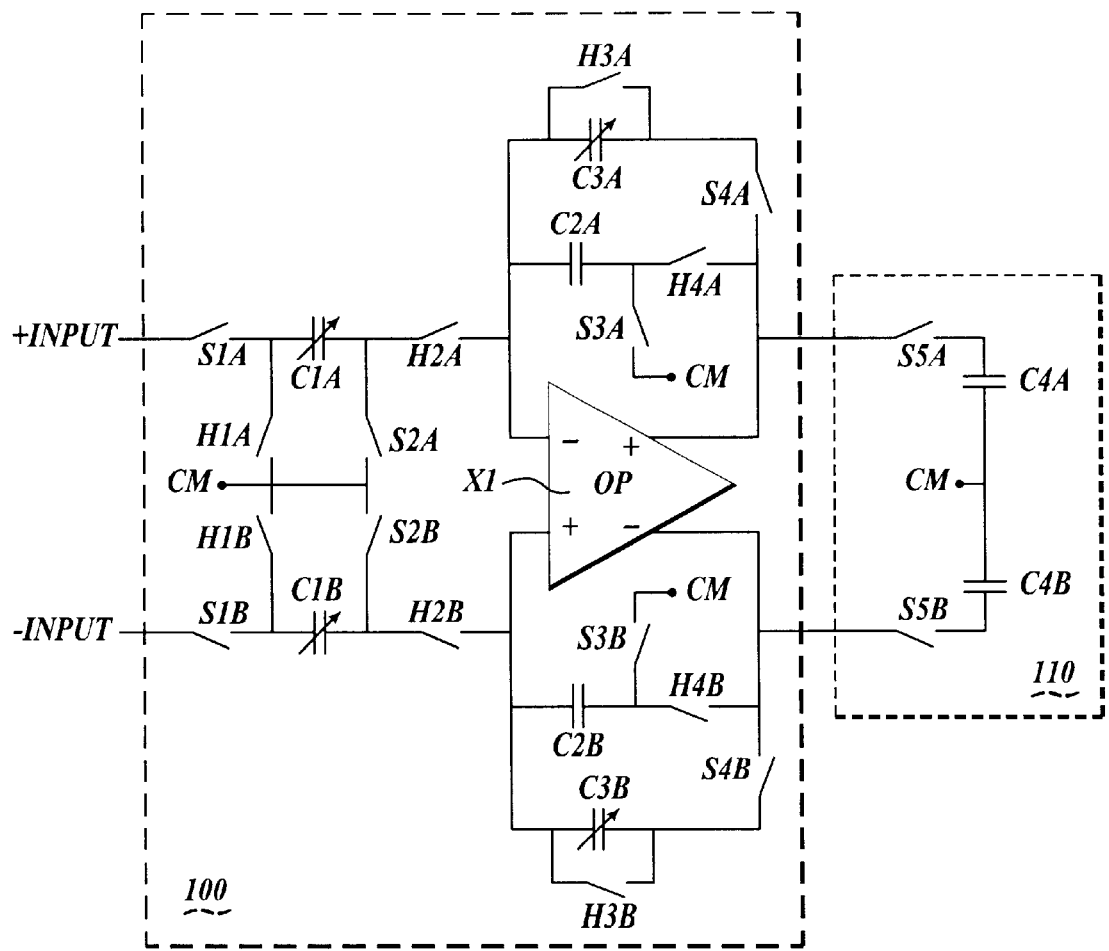
FIG. 1 is a schematic of an example single stage switched capacitor programmable gain amplifier in accordance with the present invention.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

The present invention is directed towards a single stage switched capacitor programmable gain amplifier. The operation of the amplifier is described by a transfer function having two gain factors: (C1/C2) and (C2/C3). The transfer function is equal to the product of the two gain factors: (C1/C2)×(C2/C3) such that the transfer function is equal to (C1/C3). The combination of the two different gain factors provides a wider range and finer step programmability of the amplifier. Additionally, the amplifier requires less switching which results in reducing the thermal noise and the switching noise produced by the amplifier. Moreover, the amplifier can operate without an idle stage, which operation reduces redundancy and undesirable power dissipation during the time in which the amplifier is in an idle state.

FIG. 1 is a schematic of an example single stage switched capacitor programmable gain amplifier in accordance with the present invention. Programmable gain amplifier (PGA) 100 includes capacitors C1A, C1B, C2A, C2B, C3A and C3B, switching circuits S1A, S1B, S2A, S2B, S3A, S3B, H1A, H1B, H2B, H3A, H3B, H4A, H4B, S4A, and S4B, and amplifier X1. Amplifier X1 is typically a high performance amplifier such as a folded cascode amplifier, or a higher gain amplifier (such as a gain boosted folded cascode amplifier) can be used for even higher performance. Example input circuit 110 shows an input of another circuit that is suitable for use with PGA 100. Circuit 110 comprises switching circuits S5A and S5B, and capacitors C4A and C4B.

PGA 100 is a differential amplifier having a differential input signal, which reduces noise by providing common mode noise rejection. Each half of the differential input signal is processed by the "positive input side" (side "A") or the "negative input side" of PGA 100. Node CM is a common mode voltage, which is typically selected to be about half of the supply voltage. For simplicity, discussion related to the positive input side also applies to the negative input side unless the context clearly indicates otherwise. Also for simplicity, switching circuits designated with an initial "S" are assumed in the discussion to be closed during the sampling phase and open during the holding phase. Likewise, switching circuits designated with an initial "H" are assumed the discussion to be open during the sampling phase and closed during the holding phase.

Briefly stated, PGA 100 uses the capacitors to determine to gain factors for the operational amplifier. A first gain factor performs high gain using coarse gain steps. The first gain factor is realized during the holding phase and is determined by capacitors C1A and C2A. The second gain factor is realized during the sample phase and is determined by capacitors C2A and C3A. Capacitors C1B and C2B are used to determine the first gain factor for the other side of PGA 100. Likewise, capacitors C2B and C3B are used to determine the second gain factor for the other side.

Capacitors C1A, C1B, C3A, and C3B are variable capacitors. Capacitors C1A, C1B, C3A, and C3B can be arranged as an array of capacitors within a switching matrix. The values for capacitors C1A, C1B, C3A, and C3B can be varied by selectively programming the switching matrix to activate conductive paths between certain capacitors within the array of capacitors. The relative number of capacitors within the array can be kept relatively small because the gain factor (and sample step size) is determined by the (multiplicative) product of the values of the capacitors. Thus, a wide range of amplifier parameters can be achieved while only using a relatively small number of array capacitors.

During the sample phase, the positive side of an analog input signal is sampled by capacitor C1A in response to switching circuits S1A and S2A being closed. A charge on capacitor C2A (stored thereon during the previous holding period) is transferred to capacitor C3A in response to closing switching circuits S3A and S4A being closed. No charge is left in capacitor C2A after the transfer of charge. The charge on capacitor C3A is amplified by amplifier X1 (using a capacitive feedback path that is associated with capacitor C3A) in response to closing switching circuits S3A and S4A.

The gain of PGA 100 during the sampling phase is selected to be relatively low. The transfer gain is equal to the value (C2/C3), where capacitor C2 is selected to be slightly larger than capacitor C3 to obtain a low gain value. Capacitor C4 (which is the input of a next stage or other switched capacitor device) is also coupled to PGA 100 during the sampling phase. The operation of the sampling phase of PGA 100 is further described below with respect to FIG. 2.

During the holding phase, capacitor C3A is reset in response to switching circuit H3A being closed. Charge that is stored on capacitor C1A is transferred to capacitor C2A in response to closing switching circuits H1A, H2A. The charge on capacitor C2A and is amplified by amplifier X1 in response to switching circuit H4A being closed.

The gain of PGA 100 during the holding phase is selected to be relatively high. The transfer gain is equal to the value (C1/C2), where capacitor C2 is selected to be much smaller than capacitor C1 to obtain a high gain value. Capacitor C4 (which is the input of a next stage or other switched capacitor device) is not coupled to PGA 100 during the holding phase. The operation of the holding phase of PGA 100 is further described below with respect to FIG. 3.

Figure 2:
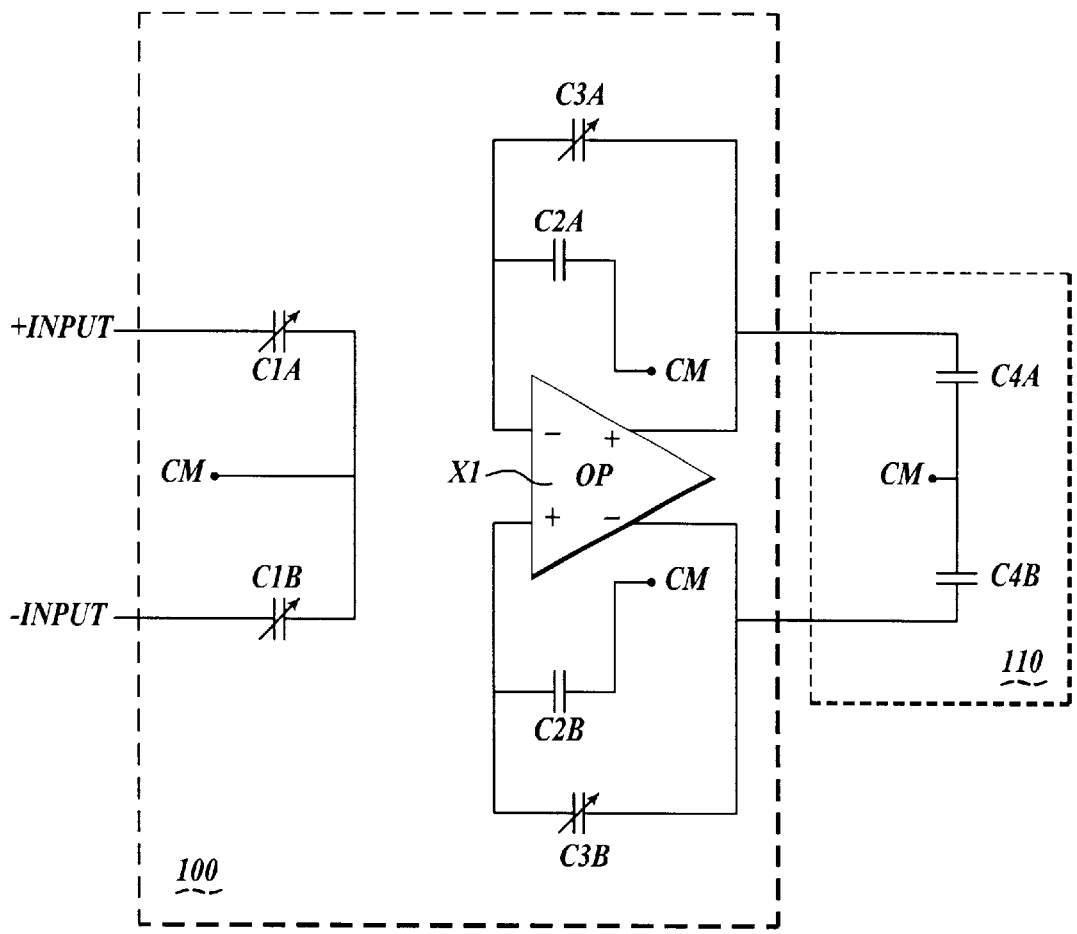
FIG. 2 is a schematic of an example single stage switched capacitor programmable gain amplifier during a sampling phase in accordance with the present invention.

FIG. 2 is a schematic of an example single stage switched capacitor PGA during a sampling phase in accordance with the present invention. During the sampling phase, the input signal is sampled on C1A and C1B. The amplified outputs of the previous holding phase (that have been amplified with ratio of C2/C1) are amplified by amplifier X1 (using a capacitive feedback path that is associated with capacitor C3A) according to the ratio of C2/C3. When the amplification is complete, the outputs can be sampled by sampling capacitors C4A and C4B of the next stage (or other switched capacitor device). Capacitors C2A and C2B are discharged in response to being coupled to node CM.

Figure 3:
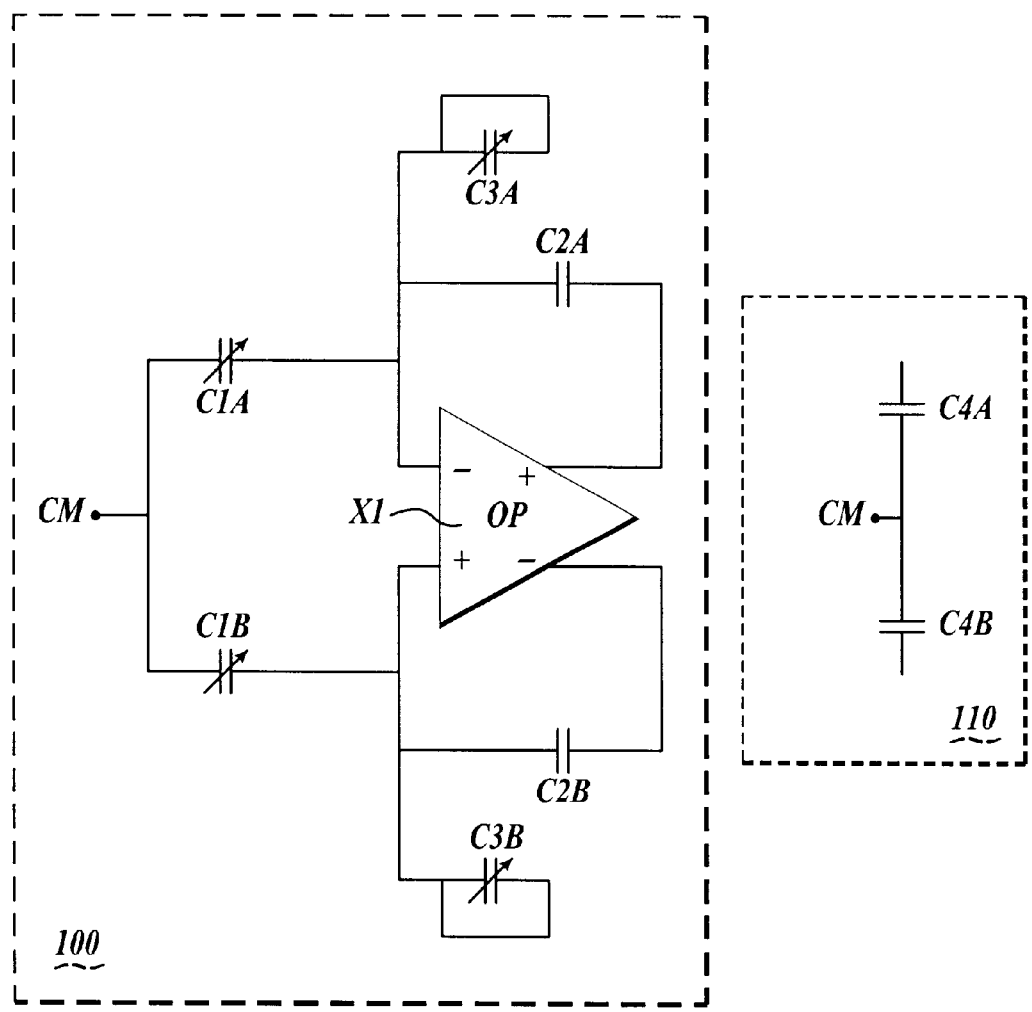
FIG. 3 is a schematic of an example single stage switched capacitor programmable gain amplifier during a holding phase in accordance with the present invention.

FIG. 3 is a schematic of an example single stage switched capacitor PGA during a holding phase in accordance with the present invention. During the holding phase, sampled charges that are stored on capacitors C1A and C1B are amplified and transferred to feedback capacitors C2A and C2B according to the ratio of C1/C2. The charges on C3A and C3B are discharged in response to being coupled to node CM.

Figure 4:
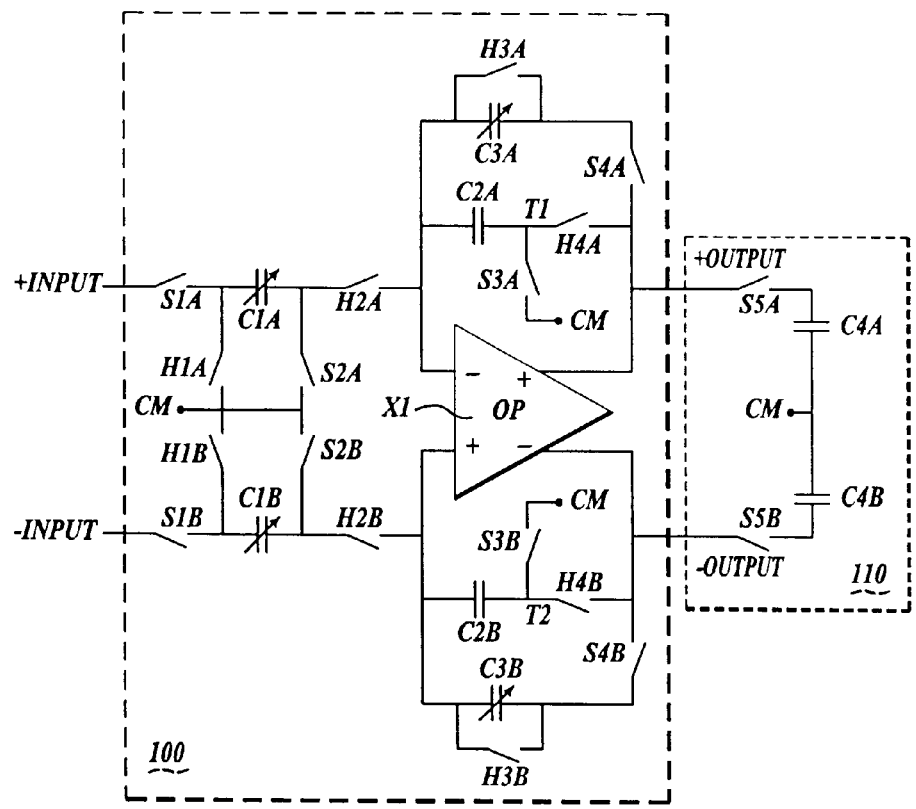
FIG. 4 is a timing diagram of signal flow in an example single stage switched capacitor programmable gain amplifier in accordance with the present invention.
Figure 4:
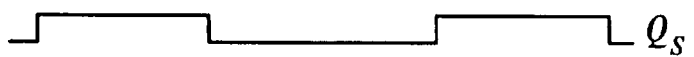
Figure 4:
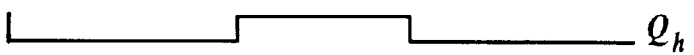
Figure 4:
Figure 4:
Figure 4:
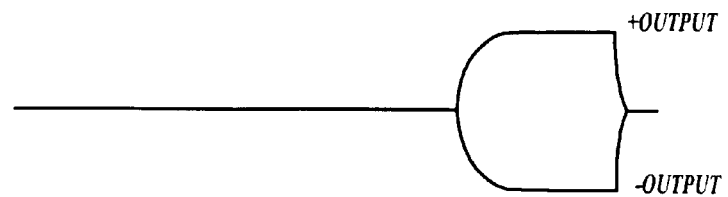

FIG. 4 is a timing diagram of signal flow in an example single stage switched capacitor programmable gain amplifier in accordance with the present invention. The input signal is sampled on capacitors C1A and C1B during the sampling phase (when node $Q_S$ is high). The sampled input signal is amplified with ratio of C1/C2 during the holding phase (when node $Q_H$ is high) and stored on capacitors C2A and C2B. During the next sampling phase, the input signal is again sampled on capacitors C1A and C1B (not shown). Also during the next sampling phase, the amplified signals (which are stored on capacitors C2A and C2B) are amplified again according to the ratio of C2/C3. The charges stored by capacitors C2A and C2B is completely transferred to C3A and C3B respectively, such that no resetting is required to remove a residual charge on capacitor C2A and C2B. At the end of the sampling period, the output signal can be sampled by the sampling capacitor of a next, stage (or other switched capacitor device).

Figure 5:
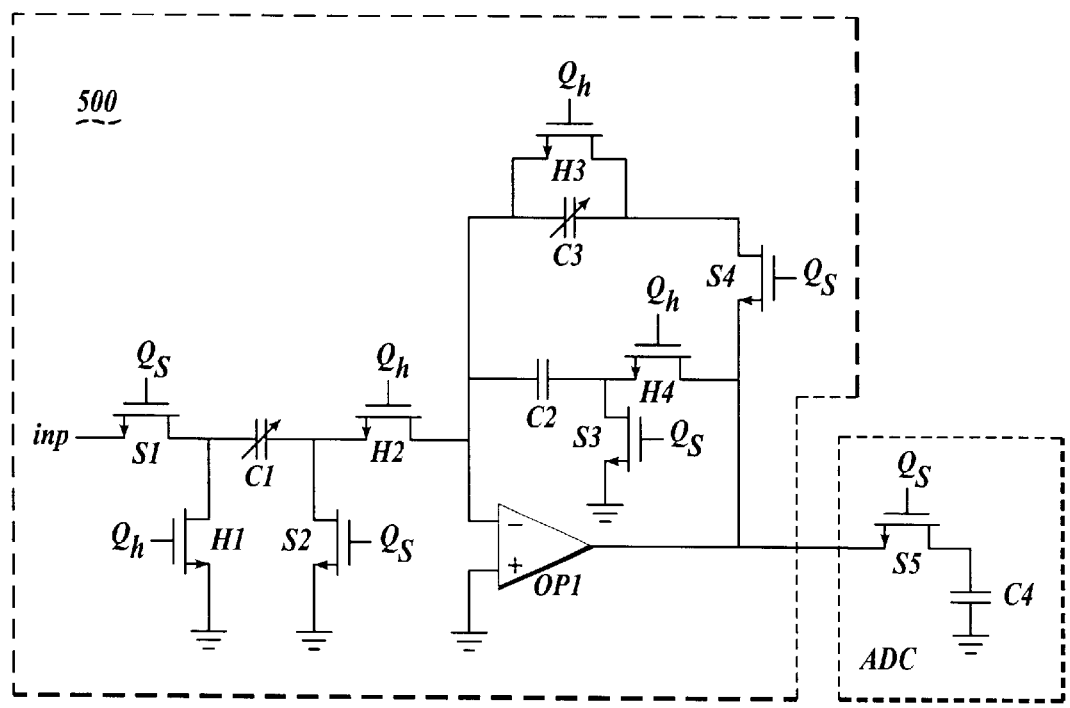
FIG. 5 is a schematic of an example single-ended single stage switched capacitor programmable gain amplifier in accordance with the present invention.

FIG. 5 is a schematic of an example single-ended single stage switched capacitor PGA in accordance with the present invention. PGA 500 is a single-ended embodiment of the present invention. Switching circuits S1–S5 and H1–H4 are implemented as CMOS transistors. Switching circuits S1–S5 and H1–H4 operate in similar fashion as discussed above to switching circuits S1A–S5A and H1A–H4A, respectively. Switching circuits S1–S5 are closed during the sampling phase and are open during the holding phase. Switching circuits H1A–H4A are open during the sampling phase and are closed during the holding phase. The input signal is referenced to a ground voltage reference (as compared with a common mode reference used in PGA 100). The analog signal flow of PGA 500 is similar the analog signal flow shown in FIG. 4, except that the differential signals are single-ended.

Other embodiments of the invention are possible without departing from the spirit and scope of the invention. The above specification, examples and data provide a complete description of the manufacture and use of the composition of the invention. Since many embodiments of the invention can be made without departing from the spirit and scope of the invention, the invention resides in the claims hereinafter appended.

I claim:

1. A switched capacitor programmable amplifier circuit, comprising:

a first capacitor that is configured to store a sampled charge that is associated with an input signal during a sampling phase and transfer the sampled charge during a holding phase;

a second capacitor that is configured to discharge during the sampling phase and provide a first capacitive feedback path such that a first amplified charge is stored on the second capacitor during the holding phase;

a third capacitor that is configured to provide a second capacitive feedback path during the sampling phase and discharge during the holding phase; and an amplifier that is configured to amplify the transferred sampled charge using the first capacitive feedback path to produce the first amplified charge during the holding phase and amplify the stored first amplified charge using the second capacitive feedback path to produce a second amplified charge during the sampling phase.

2. The circuit of claim 1, wherein the amplifier is further configured to transfer the sampled charge according to a ratio that is determined by the capacitance of the first capacitor divided by the capacitance of the second capacitor.

3. The circuit of claim 1, wherein the amplifier is further configured to amplify the stored first amplified charge according to a ratio that is determined by the capacitance of the second capacitor divided by the capacitance of the third capacitor.

4. The circuit of claim 1, wherein the amplifier is further configured to amplify the transferred sampled charge according to a ratio that is determined by the capacitance of the first capacitor divided by the capacitance of the third capacitor.

5. The circuit of claim 1, wherein the third capacitor is further configured to transfer charge to a switched capacitor circuit.

6. The circuit of claim 1, wherein the first and the third capacitors are variable capacitors.

7. The circuit of claim 6, wherein the gain factor is proportional to the value of the first capacitor and inversely proportional to the value of the third capacitor.

8. A circuit for amplifying a signal, comprising:

means for storing a sampled charge that is associated with an input signal during a sampling phase on a first capacitor;

means for transferring the sampled charge from the first capacitor during the holding phase;

means for providing a first capacitive feedback path through which a first amplified charge is stored on a second capacitor during the holding phase;

means for providing a second capacitive feedback path during the sampling phase;

means for amplifying the transferred sampled charge using the first capacitive feedback path to produce the first amplified charge during the holding phase; and means for amplifying the stored first amplified charge using the second capacitive feedback path to produce a second amplified charge during the sampling phase.

9. The circuit of claim 8, wherein the means for transferring the sampled charge transfers the sampled charge according to a ratio that is determined by the capacitance of the first capacitor divided by the capacitance of the second capacitor.

10. The circuit of claim 8, wherein the means for amplifying the stored first amplified charge amplifies the stored first amplified charge according to a ratio that is determined by the capacitance of the second capacitor divided by the capacitance of the third capacitor.

11. The circuit of claim 8, wherein the means for amplifying the transferred sampled charge amplifies the transferred sampled charge according to a ratio that is determined by the capacitance of the first capacitor divided by the capacitance of the third capacitor.

12. The circuit of claim 8, further comprising means for selecting the values of the first and third capacitors.

13. A method for amplifying a signal, comprising:

storing a sampled charge that is associated with an input signal during a sampling phase on a first capacitor;

transferring the sampled charge from the first capacitor during the holding phase;

providing a first capacitive feedback path through which a first amplified charge is stored on a second capacitor during the holding phase;

providing a second capacitive feedback path during the sampling phase;

amplifying the transferred sampled charge using the first capacitive feedback path to produce the first amplified charge during the holding phase; and amplifying the stored first amplified charge using the second capacitive feedback path to produce a second amplified charge during the sampling phase.

14. The method of claim 13, wherein the sampled charge is transferred according to a ratio that is determined by the capacitance of the first capacitor divided by the capacitance of the second capacitor.

15. The method of claim 13, wherein the stored first amplified charge is amplified according to a ratio that is determined by the capacitance of the second capacitor divided by the capacitance of the third capacitor.

16. The method of claim 13, wherein the transferred sampled charge is amplified according to a ratio that is determined by the capacitance of the first capacitor divided by the capacitance of the third capacitor.

17. The method of claim 13, further comprising transferring charge from the third capacitor to a switched capacitor circuit.

18. The method of claim 13, further comprising selecting the values of the first and third capacitors.

* * * * *